United States Patent [19]

Mochiji et al.

[11] 4,307,176
[45] Dec. 22, 1981

[54] METHOD OF FORMING A PATTERN

[75] Inventors: Kozo Mochiji, Niiza; Shinji Okazaki, Urawa; Shojiro Asai, Kanagawa, all of Japan

[73] Assignee: Hitachi, Ltd., Tokyo, Japan

[21] Appl. No.: 94,329

[22] Filed: Nov. 14, 1979

[30] Foreign Application Priority Data

Nov. 15, 1978 [JP] Japan ............................... 53-139873

[51] Int. Cl.³ .............................................. B05D 3/06
[52] U.S. Cl. ................................... 430/270; 427/43.1; 430/328; 430/330; 430/326
[58] Field of Search .................... 427/43.2, 53.1, 54.1; 430/325, 326, 328, 330, 309, 270

[56] References Cited

U.S. PATENT DOCUMENTS 4,015,986  4/1977  Paal et al. ........................... 430/330

OTHER PUBLICATIONS

Cortellino et al., "IBM TDB", vol. 15, No. 1, Jun. 1972.

Primary Examiner—John H. Newsome
Attorney, Agent, or Firm—Craig and Antonelli

[57] ABSTRACT

A method of forming a pattern comprising heat-treating a resist film subjected to irradiation with light and thereafter removing an unhardened area of the resist film.

Since the heat treatment reduces the film thickness of the unhardened area and hardens a hardened area still more, a pattern on the order of submicrons can be readily formed.

12 Claims, 3 Drawing Figures

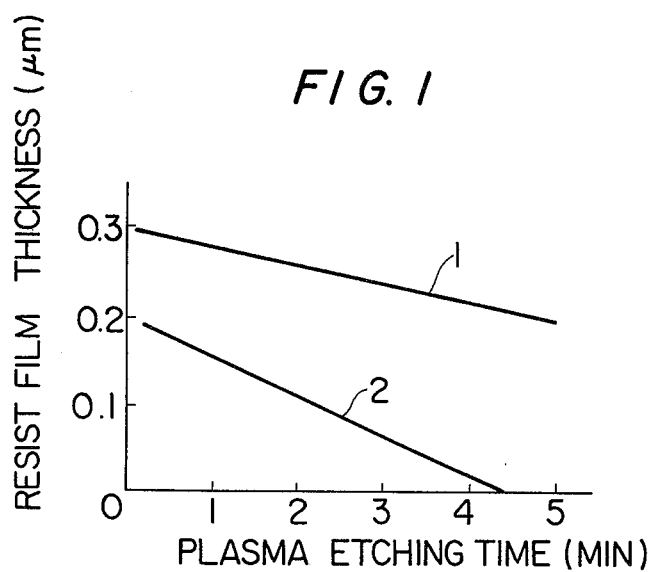
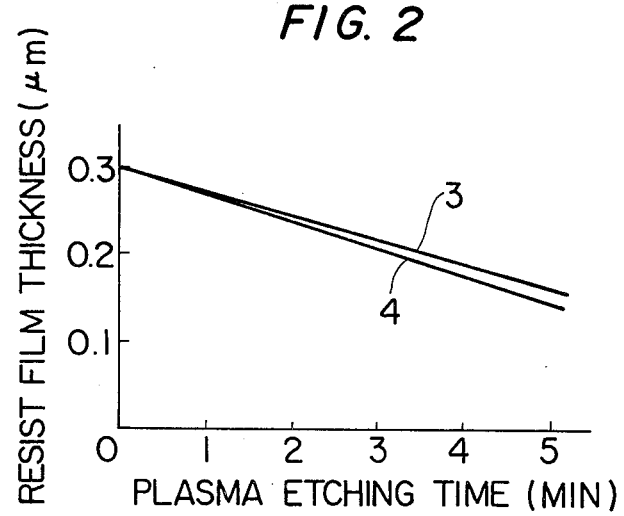

METHOD OF FORMING A PATTERN

BACKGROUND OF THE INVENTION

1. Field of the Invention

This invention relates to a method of forming a pattern. More particularly, it relates to a pattern forming method which can reliably form, at a very high accuracy, the patterns of various resists including photoresist, electron-beam resist, etc. (in this specification, such patterns shall be generally termed "resist pattern").

2. Description of the Prior Art

As is well known, a resist pattern is formed in such a way that desired parts of a resist film applied on an object surface on which the pattern is to be formed are selectively irradiated by an ultraviolet light, electron beam, X-ray, etc. (in this specification, these shall be simply termed "light"), whereupon a development is carried out.

When the resist is of the negative type, the solubility of the part irradiated by the light lowers; and when the resist is of the positive type, the solubility increases. Therefore, when the unhardened parts of the resist (parts of higher solubility) are subsequently removed by executing the proper developing treatment, the resist pattern having a desired shape is formed.

In such prior-art method of forming the pattern, however, the developing step has resorted to the wet process employing a suitable developing solution. Therefore, the resist film has been swollen with the developing solution, and it has been difficult to accurately form a microscopic pattern.

It is obvious that, in order to prevent the swelling of the resist film due to the developing solution, a dry type development may be made with any of various dry etchings such as plasma etching and sputter etching without using any developing solution.

However, merely by changing only the developing step from the wet process to the dry process in the prior-art pattern forming method, it has been impossible in practice to selectively remove only the unhardened area of the resist film by the dry etching and to accurately form the microscopic pattern because the difference of etching rates for the hardened area and unhardened area of the resist film is small.

SUMMARY OF THE INVENTION

An object of this invention is to solve the problem involved in the prior-art pattern forming method and to provide a pattern forming method which can accurately form a microscopic resist pattern.

In order to accomplish the object, this invention irradiates desired parts of a resist film with light and thereafter subjects the resist film to a heat treatment (in this specification, the heat treatment shall be called "afterbaking"), thereby making it possible to prevent the swelling in the wet type development, to increase choice for dry etchings, etc.

BRIEF DESCRIPTION OF THE DRAWINGS

FIGS. 1 and 2 are graphs showing the relationships between the plasma etching time and the resist film thickness in pattern forming methods of this invention and a prior art, respectively.

DETAILED DESCRIPTION OF THE PREFERRED EMBODIMENTS

Figure 3:
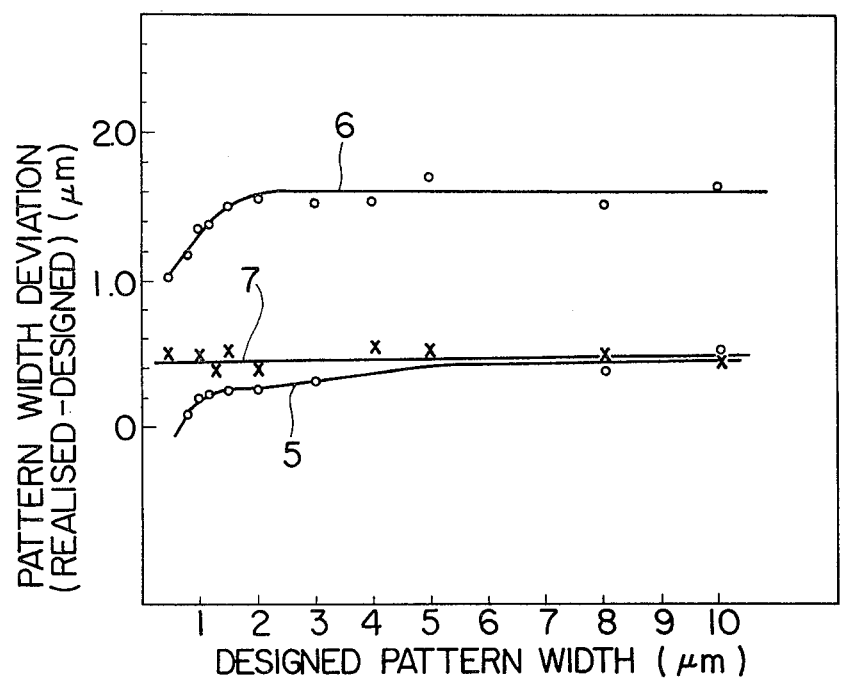
FIG. 3 is a graph for elucidating an embodiment of this invention.

Hereinafter, this invention will be described in detail with reference to examples.

EXAMPLE 1

On one major surface of a substrate which was made from a quartz glass plate, the copolymer of methyl methacrylate and acrylonitrile [P(MMA-AN)] (89:11 (mol ratio)) was applied as a resist film to a thickness of 0.3 $\mu$m.

The resist film was heat-treated at 170° C. for 30 minutes. Although this heat treatment (in this specification, the heat treatment which is executed before irradiation with light shall be termed "pre-baking") is not indispensable to the present invention, it is effective to densify the film by volatilizing a solvent and to prevent dust etc. from sticking thereto, and hence, it is more preferable to carry out the pre-baking before irradiation with light.

Subsequently, the resist film was irradiated by an electron beam so as to increase the solubility of the irradiated area. Although the electron beam was employed for the irradiation in the present example, it is a matter of course that radiation usable in this step is not limited to the electron beam but that an X-ray, an ultraviolet light etc. are similarly usable. In case of the irradiation with the electron beam, it is preferable to set the quantity of irradiation at $8\times10^{-8}-2\times10^{-5}$ coulomb/cm$^2$ in terms of the charge density.

The resist film irradiated with light was subjected to an after-baking at 170° C. for 30 minutes. Since the copolymer P(MMA-AN) is a positive type resist, the solubility of the area irradiated by light increases. When the after-baking is conducted under a normal or a reduced pressure (about 1 to 5 torr) after the light irradiation, a part of the area irradiated with light volatilizes, and the thickness of this area becomes approximately ⅔. It is preferable that the temperature of the after-baking lies within a range of approximately 100°–200° C. Below 100° C., the irradiated area (unhardened area) hardly volatilizes, so that the effect of this invention is very low. On the other hand, when the after-baking is carried out at a temperature higher than 200° C., the unirradiated area (hardened area) volatilizes simultaneously, so that the selectivity lowers conspicuously. The period of time during which the after-baking is carried out is 30–60 minutes in usual cases. While the preferable temperature range of the after-baking is approximately 100°–200° C., more preferable results are obtained at 150°–200° C. in case of P(MMA-AN).

Subsequently, the plasma etching was conducted under the conditions of a power of 100 W and an oxygen pressure of 1 Torr, to remove the irradiated area and to form a pattern.

FIG. 1 is a graph showing the relationships in this case between the period of time of the plasma etching and the thickness of the resist film remaining on the substrate. Straight lines 1 and 2 indicate the relationships in the unirradiated area and the irradiated area, respectively.

As apparent from FIG. 1, etching rates by the plasma etching caused a remarkable difference owing to the after-baking. The irradiated area was fully removed by the plasma etching for 5 minutes, whereas the unirradiated area was removed only a thickness of 0.1 $\mu$m even when subjected to the plasma etching for 5 minutes.

Accordingly, when the after-baking is executed after the light irradiation and the substrate is processed by plasma etching, only the unhardened area can be selectively etched and removed without any substantial etch of the hardened area of the resist film, and a microscopic resist pattern can be formed at high accuracy.

On the other hand, when the plasma etching is executed without performing the after-baking, the etching rates of the irradiated area and the unirradiated area become as illustrated by straight lines 3 and 4 in FIG. 2 respectively, and they have almost no difference. It is accordingly impossible to remove the irradiated area and form the pattern by the plasma etching without the after-baking.

Although the plasma etching was employed as the dry etching in the present example, it is needless to say that other well-known dry etching methods such as sputtering are similarly applicable.

EXAMPLE 2

In Example 1, after performing the after-baking, the resist pattern was formed by the dry type development resorting to the dry etching. However, a favorable result can also be achieved by a wet type development employing a developing solution.

More specifically, when the after-baking is carried out after the light irradiation, the film thickness of the unhardened area decreases, and simultaneously, the hardened area hardens more. Therefore, even when the resist film is immersed in the developing solution, the swelling of the hardened area due to the developing solution is much less than in case of the prior-art method executing the development without the after-baking, and a resist pattern which has a high resolution can be formed.

A substrate made from quartz glass was coated with P(MMA-AN) as a resist film to a thickness of 0.3 $\mu$m.

Thereafter the pre-baking, the light irradiation and the after-baking were performed as in Example 1, whereupon a development was carried out at 23° C. for 10 minutes by using an n-amyl acetate as a developing solution.

The resolution (the minimum interval between two separable lines) of a resist pattern which could be formed by the prior-art method performing the development without the after-baking was limited to about 1 $\mu$m. In contrast, according to this invention, submicron resist patterns having resolutions on the order of 0.5 $\mu$m could be stably formed because the swelling of the resist with the developing solution was much less.

EXAMPLE 3

On a substrate of quartz, a chromium film (800 Å thick) and a chromium oxide film (1,200 Å thick) were stacked and formed. Further, a P(MMA-AN) film having a thickness of 0.33 $\mu$m was deposited thereon.

After performing a pre-baking at 170° C.±3° C. for 30 minutes, a desired area of the p(MMA-AN) film was irradiated with an electron beam in a quantity of irradiation of $1 \times 10^{-5}$ coulomb/cm$^2$ in terms of the charge density.

Using isoamyl acetate as a developing solvent, a development was made. Then, the relationship between a designed pattern width and a pattern width deviation (the difference between an actually realized pattern width and the designed pattern width) was obtained to study the influence of the presence of the after-baking on the pattern width deviation.

Results obtained are indicated in FIG. 3.

In FIG. 3, curves 5 and 6 correspond to cases where developments at 25° C. for 10 minutes and at 25° C. for 15 minutes were conducted without the after-baking, respectively, and a straight line 7 corresponds to a case where a development at 25° C. for 20 minutes was conducted after performing an after-baking (at 170° C. for 45 minutes).

As seen from the curves 5 and 6 in FIG. 3, with the prior-art method performing no after-baking, the pattern width deviation varies conspicuously in dependence on the designed pattern width, and a plurality of resist patterns of a variety of widths cannot be formed at an identical dimensional accuracy.

In contrast, in case of this invention, as seen from the straight line 7, the pattern width deviation undergoes substantially no variation even when the designed pattern width varies, and a plurality of resist patterns of a variety of widths can be formed at an identical dimensional accuracy.

Moreover, in the case of the straight line 7, the developing period of time was longer than in the other cases. Accordingly, the absolute value of the pattern width deviation ought to have become greater than in the other cases on account of a greater influence by the swelling. Nevertheless, it was smaller in the case of this invention than in one of the other cases of shorter developing periods of time as understood from FIG. 3.

In the foregoing examples, P(MMA-AN) was employed as the resist. Since, however, this invention consists in hardening the hardened area of the resist still more and simultaneously reducing the thickness of the unhardened area by means of the after-baking, thereby to permit the microscopic working, it is needless to say that resists other than the above-mentioned P(MMA-AN) can be similarly used. Similar favorable results can be obtained even with many other positive type resists than P(MMA-AN), for example, PMMA (polymethyl methacrylate), FBM (hexafluorobutyl methacrylate) and P(MMA-MA) (80:20 (mol ratio)) which is the copolymer of methyl acrylate and methacrylic acid.

Besides the positive type resists (about 0.2 to 0.5 $\mu$m thickness), this invention can employ negative type resists (about 0.3 to 0.9 $\mu$m thickness). There can be used, for example, PGMA (poly Glycidyl Methacrylate), SEL-N (Trade Mark, Sommar Co.) and EPB (Epoxized Poly Butadiene).

Since the effect owing to the after-baking is greater with the positive type resist, the use of the positive type resist can produce a more favorable result.

The temperatures of the after-baking which can be performed in this invention are on the order of 100°–200° C. as previously stated. The optimum temperature of the after-baking is closely related with the sorts of resists and the conditions of light irradiation, and is therefore selected appropriately so as to maximize the difference of the etching rates for the hardened area and the unhardened area. By way of example, the optimum temperatures in the cases of employing P(MMA-AN), PMMA and PMIPK (PolyMethyl Iso Propenyl Ketone) were about 150° C., 120° C. and 170° C. respectively, and the best results were obtained when the temperatures of after-baking treatments were made these values.

The influence by the period of time of the after-baking is not very great. When the period of time is shorter than 30 minutes, it is feared that the effect of the after-baking will be insufficient. Therefore, the resist film should be heated for 30 minutes or longer in order to ensure a favorable result. However, even when the after-baking is conducted for a very long time, the effect of the after-baking is not enhanced, so that the heating for more than 60 minutes is insignificant. Accordingly, the period of time of the after-baking in this invention should preferably be made approximately 30–60 minutes in practical use.

As understood from the above description, this invention adds the simple step of after-baking after light irradiation, thereby making it possible to use dry etching as a developing expedient and also to effectively prevent objectionable swelling even in case of employing a wet type development. Thus, this invention makes it possible to reliably form submicron patterns on the order of 0.5 μm, and it brings forth very great advantages.

What is claimed is:

1. A method of accurately forming a microscopic pattern, comprising:
   (a) the step of depositing a positive electron beam resist film on an object surface on which the pattern is to be formed,
   (b) the step of irradiating a desired area of said resist film with an electron beam to increase the solubility of the irradiated area, thereby forming an unhardened irradiated area in said resist film,
   (c) the step of heat-treating said electron beam resist film to approximately 100°–200° C. at a reduced pressure of about 1 to 5 torr to decrease the thickness of the irradiated area by volatization, and
   (d) the step of removing the unhardened area of said electron beam resist film.

2. A method of forming a pattern as defined in claim 1, wherein pre-baking is performed prior to the step (b).

3. A method of forming a pattern as defined in claim 1 or 2, wherein the step (d) is performed by dry etching.

4. A method of forming a pattern as defined in claim 1 or 2, wherein the step (d) is performed by a wet type development.

5. A method of forming a pattern as defined in claim 1 or 2, wherein the heat treatment in the step (c) is performed for 30–60 minutes.

6. A method of forming a pattern as defined in claim 1, wherein the positive type resist is selected from the group consisting of a copolymer of methyl methacrylate and acrylonitrile, polymethyl methacrylate, hexafluorobutyl methacrylate, and a copolymer of methyl methacrylate and methacrylic acid.

7. A method of forming a pattern as defined in claim 3, wherein the dry etching is either plasma etching or sputtering.

8. A method of forming a pattern as defined in claim 7, wherein the dry etching is plasma etching.

9. A method of forming a pattern as defined in claim 4, wherein a compound selected from the group consisting of N-amyl acetate and isoamyl acetate is used in the wet-type development.

10. A method of forming a pattern as defined in claim 1, wherein the heat-treating of step (c) is performed at approximately 150°–200° C.

11. A method of forming a pattern as defined in claim 2, wherein the pre-baking is at about 170° C.

12. A method of forming a pattern as defined in claim 5, wherein the electron beam has a charged density of about $8\times10^{-8}$ to $2\times10^{-5}$ coulomb/cm$^2$.

* * * * *